United States Patent [19]

Lindeman et al.

[11] Patent Number: 5,013,249
[45] Date of Patent: May 7, 1991

[54] ELECTRICAL CONNECTORS

[75] Inventors: Richard J. Lindeman, Wood Dale, Ill.; Robert J. Smith, II, Austin, Tex.

[73] Assignee: Labinal Components and Systems, Inc., Elk Grove Village, Ill.

[21] Appl. No.: 406,142

[22] Filed: Sep. 12, 1989

Related U.S. Application Data

[60] Continuation-in-part of Ser. No. 297,303, Jan. 13, 1989, abandoned, which is a division of Ser. No. 947,317, Jun. 19, 1986, Pat. No. 4,806,110, which is a continuation-in-part of Ser. No. 876,179, Jun. 19, 1986, Pat. No. 4,710,133, which is a continuation-in-part of Ser. No. 352,499, May 16, 1989, which is a continuation-in-part of Ser. No. 375,588, Jul. 5, 1989.

[51] Int. Cl.$^5$ .................... H01R 9/09; H01R 13/648
[52] U.S. Cl. ........................ 439/66; 439/69; 439/74; 439/75; 439/92; 439/591
[58] Field of Search ............ 439/65, 66, 68, 69, 439/74, 75, 91, 92, 108, 591, 817, 840, 841, 247

[56] References Cited

U.S. PATENT DOCUMENTS

| | | | |
|---|---|---|---|
| 4,133,592 | 1/1979 | Cobaugh et al. | 439/74 |
| 4,581,679 | 4/1986 | Smolley | 439/66 |
| 4,688,864 | 8/1987 | Sorel | 439/74 |
| 4,705,332 | 11/1987 | Sadigh-Benzadi | 439/69 |
| 4,859,806 | 8/1989 | Smith | 439/75 |
| 4,889,496 | 12/1989 | Neidich | 439/75 |

Primary Examiner—Paula A. Bradley
Attorney, Agent, or Firm—Neuman, Williams, Anderson & Olson

[57] ABSTRACT

Electrical connectors including a row of conductive interconnect elements in the form of slugs which extend through openings in a block of insulating material and which are associated resilient wadded elements to connect conductive pads of circuit boards. A wall portion of conductive material is positioned in parallel relation to the row or elements to provide a ground plane and an air dielectric is provide along the length of each element to cooperate with the dielectric of the block and obtain a desired characteristic impedance.

22 Claims, 4 Drawing Sheets

ELECTRICAL CONNECTORS

REFERENCES TO RELATED APPLICATIONS

This application continues, in part, subject matter which is disclosed in the co-pending application of Richard Jay Lindeman, U.S. Ser. No. 07/297,303, filed Jan. 13, 1989, now abandoned said application being a division of a co-pending application of Richard Jay Lindeman, Ser. No. 947,317, issued Feb. 21, 1989 as U.S. Pat. No. 4,806,110. Said application Ser. No. 947,317 is a continuation-in-part of a co-pending application of Richard Jay Lindeman, filed June 19, 1986, U.S. Ser. No. 876,179, issued as U.S. Pat. No. 4,710,133 on Dec. 1, 1987. This application also continues in part subject matter which is disclosed in the copending application of Albert Nicholas Hopfer, III and Richard Jay Lindeman, Ser. No. 07/352,499, filed May 16, 1989 and subject matter which is disclosed in the copending application of Richard Jay Lindeman and Saeed U. Zafar, Ser. No. 07/375,588, filed July 5, 1989. The disclosures of said applications are incorporated by reference.

BACKGROUND OF THE INVENTION

1. Field of the Invention

This invention relates to electrical connectors and more particularly to electrical connectors which are usable for installation between circuit boards or other components for propagation of high frequency signals as well as electrical power therebetween. The connectors of the invention are readily installed and are highly efficient and reliable, while being readily and economically manufacturable.

2. Background of the Prior Art

Many different types of electrical connectors have heretofore been used or proposed in the prior art, including electrical connectors which utilize wadded conductor contacts or buttons which generally include "wads" of fine wire which are placed in holes in a carrier of insulating material in position to be compressed between the surfaces of a pair of conductors to be connected. Such conductive wads are advantageous in that they have very low resistance to current and also in that they have very low inductance and are otherwise advantageous for propagation of very high frequency signals.

However, arrangements of the prior art have left something to be desired, particularly with respect to signal transmission characteristics and with respect to providing low-loss, efficient and reliable transmission of signals between circuit boards.

SUMMARY OF THE INVENTION

This invention was evolved with the general object of improving upon the prior art and more particularly for providing connectors which can be readily used for low-loss transmission of signals between separated circuit boards or other components, while being efficient and reliable and manufacturable at reasonably low cost.

A further object of the invention is to provide connectors which have optimal electrical characteristics particularly with respect to efficient and reliable propagation of high frequency signals between circuit boards or the like.

In a connector constructed in accordance with the invention, a plurality of elongated slugs of conductive material are positioned in openings in a block of insulating material with opposite terminal ends of the slugs being arranged for connection to conductive elements to be interconnected. Preferably, the terminal ends of the slugs are spaced from opposite surfaces of the block to define cavities which receive resilient wadded conductor contact elements, or buttons. The buttons are compressible between terminal end surfaces of the slugs and the surfaces of conductive elements placed in alignment with the cavities and pressed toward the opposite surfaces of the block.

The conductive elements which are interconnected through the slugs may be conductive pads of printed circuit boards or other components which may be positioned as far apart as may be desirable, to allow for circuit components which are mounted on and project from either or both sides of a board, for example. The length of the slugs and the corresponding thickness of the block may be varied to accommodate any distance between circuit boards or other components as may be required.

In accordance with important features of the invention, each conductive slug provides a signal propagation path which has a uniform characteristic impedance along the length of the slug. In addition, the characteristic impedances of all paths are controlled to be substantially the same, with a value which facilitates design of circuit boards to be interconnected. In a preferred arrangement, the cross-sectional configuration of each slug and the cross-sectional configuration of associated solid dielectric supporting material are such as to provide an air dielectric between the slug and the solid dielectric material, the dimensions of the air dielectric being controlled to obtain the desired characteristic impedance. For reasons as hereinafter discussed in detail, the result is that the design of circuit boards is facilitated and the connector provides a very high degree of efficiency and reliability in propagation of electrical signals between circuit boards or the like.

Another important feature relates to the provision of surfaces within the openings of the block to fix the position of the slugs therewithin and to obtain cavities of uniform size.

Additional important features of the invention relate to the provision of wall portions of conductive material for forming ground planes in parallel relation to the slugs and to achieve efficient propagation of high frequency energy. In accordance with the invention, buttons are provided in cavities along edges of such wall portions. It is found that such buttons permit the achievement of a substantially continuous ground plane which extends between ground conductors of circuit boards, for optimum results. Such wall portions may be part of an outer casing of the connector. In addition, one or more wall portions may extend through central portions of the block, to provide one or more ground planes which isolate one row of slugs from another row of slugs. A further important feature is that a plurality of such wall portions are usable to couple DC and/or low frequency AC voltages between circuit boards while also serving as ground conductors with respect to high frequency signals.

Other objects, features and advantages of the invention will become more fully apparent from the following detailed description taken in conjunction with the accompanying drawings.

DESCRIPTION OF PREFERRED EMBODIMENTS

Figure 1:
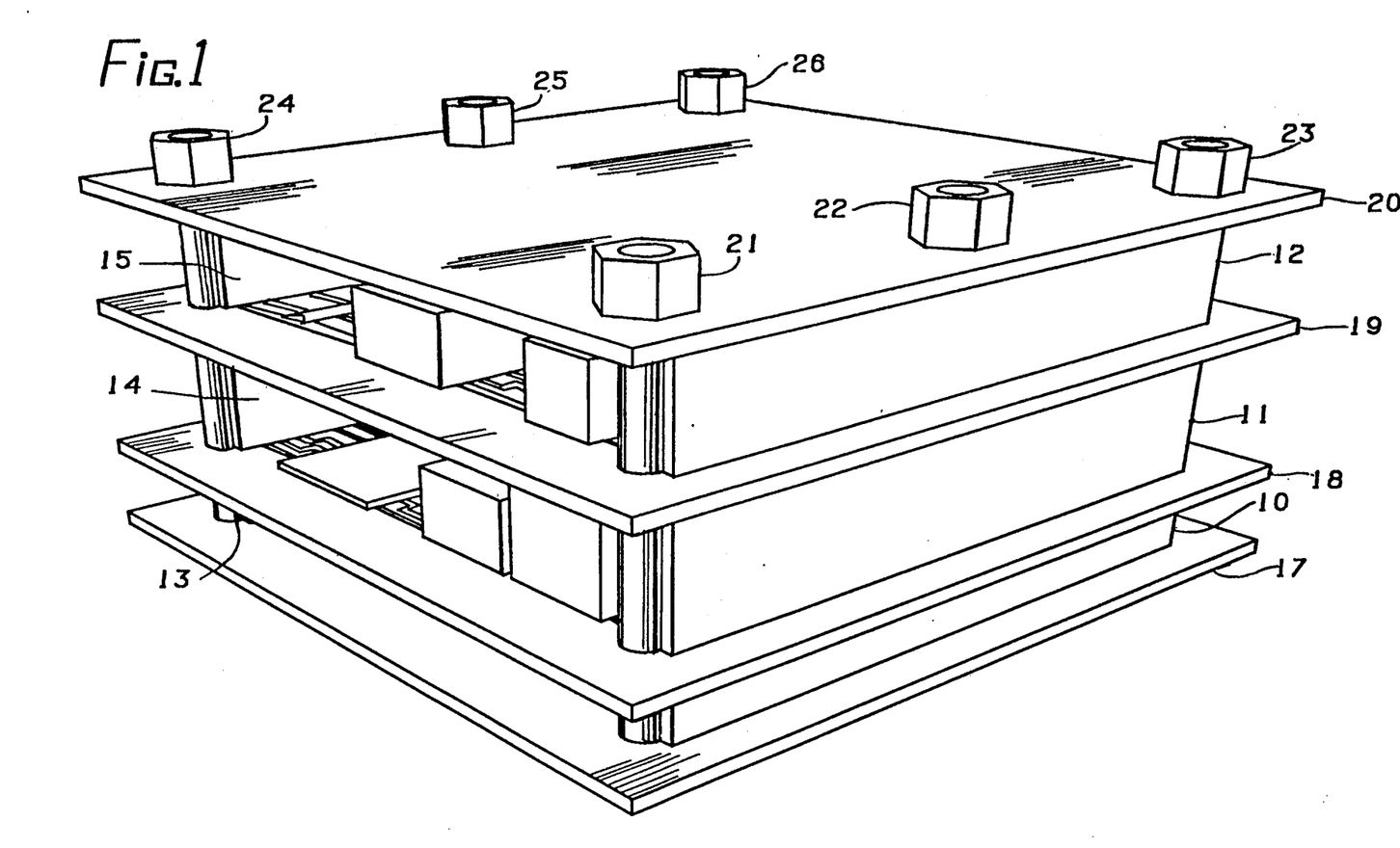
FIG. 1 is a perspective view showing electrical connectors of the invention installed in a circuit board assembly.

FIG. 1 shows six connectors 10–15 which are constructed in accordance with the principles of the invention and which are shown mounted in a circuit board assembly 16. The assembly 16 includes four circuit boards 17, 18, 19 and 20 which are mounted in a stack and which are secured together by six bolts 21–26.

The connectors 10–15 function to interconnect circuits on the boards 17–20 and also function as spacers between the boards, being installed in three pairs between edge portions of the boards, as shown. The connectors of the invention are advantageous in providing short length signal propagation paths between the boards which are shielded and isolated as required and which are of uniform impedance and otherwise highly efficient. In addition, the connectors serve to couple DC and low frequency AC voltages between the circuit boards, and a very compact assembly is achieved. As is also shown, the vertical dimensions of three pairs of connectors are different, being selected in accordance with the vertical extent of components on the boards 17–20. As illustrated, the connectors 10 and 13 have relatively small vertical dimensions while the connectors 11 and 14 and connectors 12 and 15 have larger vertical dimensions.

Figure 2:
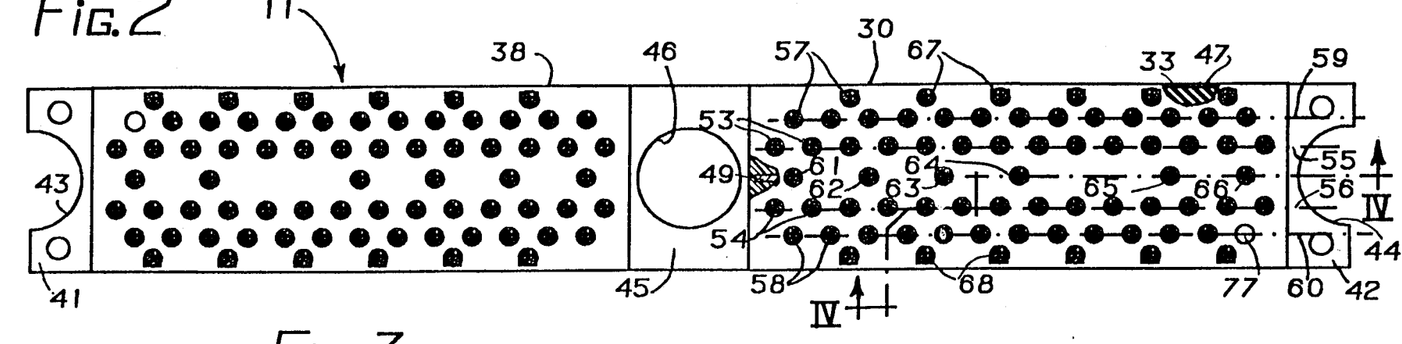
FIG. 2 is a top plan view of one of the connectors of FIG. 1.
Figure 3:
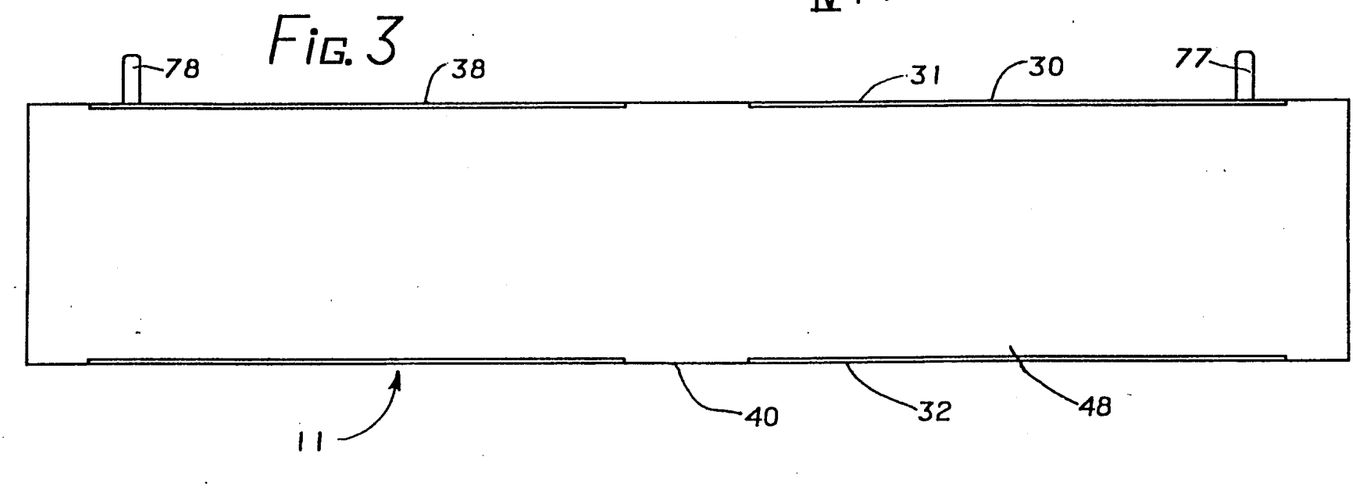
FIG. 3 is a front elevational view of the connector of FIG. 2.
Figure 4:
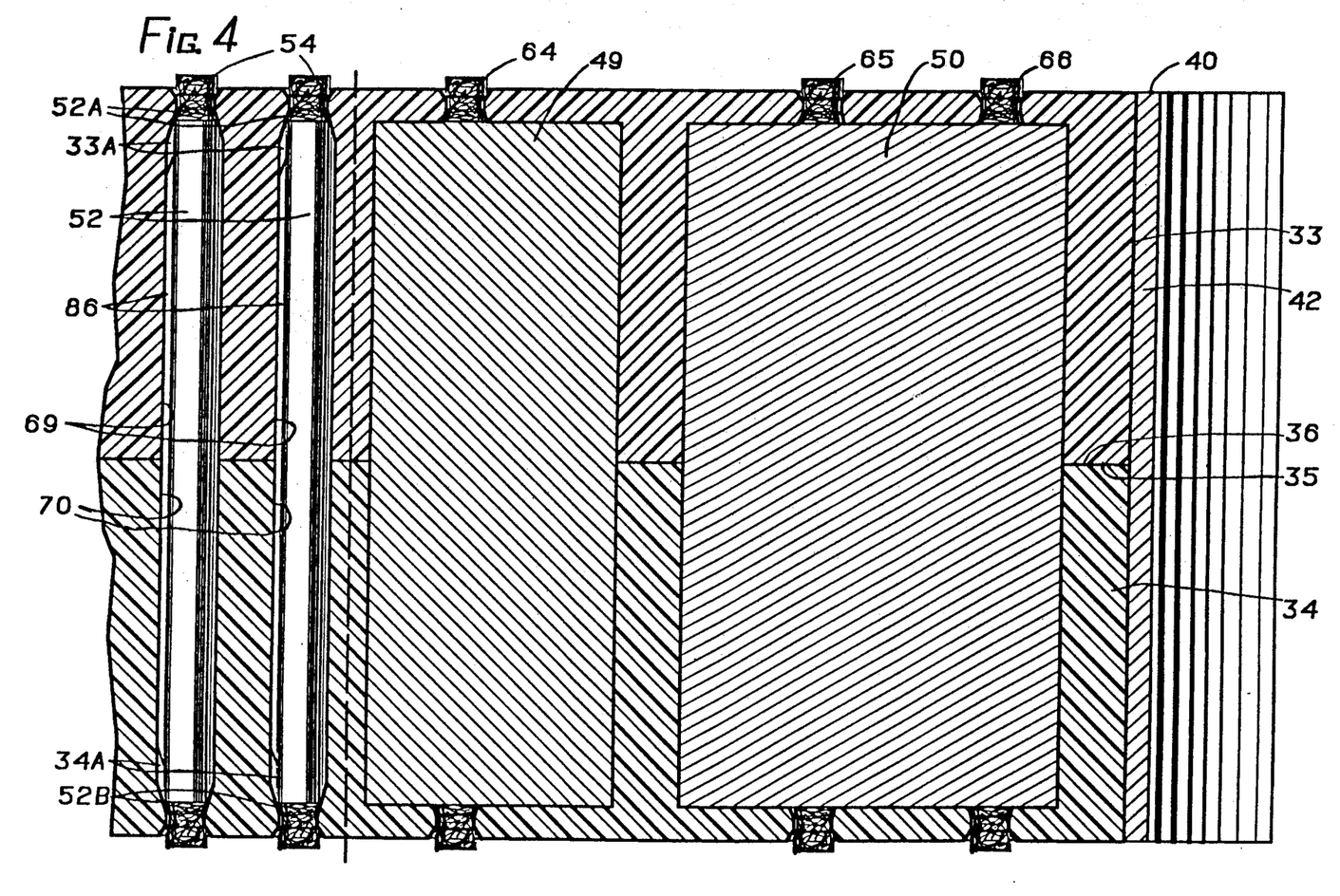
FIG. 4 is a sectional view taken substantially along line IV—IV of FIG. 2.

FIGS. 2 and 3 are respectively top plan and side elevational view of the connector 11, and FIG. 4 is a sectional view taken substantially along line IV—IV of FIG. 2. It will be understood that the constructions of the other connectors 10 and 12–15 may be like that of the connector 11, except that the connectors 10, 12, 13 and 15 may have different vertical dimensions. The connector 11 includes a block 30 which is of insulating material and which has upper and lower planar surfaces 31 and 32. Block 30 is preferably formed by upper and lower members 33 and 34 respectively having lower and upper surfaces 35 and 36 engaging in a plane which is midway between the surfaces 31 and 32 in the illustrated connector but which may be positioned at unequal distances from the surfaces 31 and 32.

In the illustrated connector 11, a second block 38 of insulating material is provided which is substantially the same as the block 30 and which is also formed by two members like the members 33 and 34 which form the block 30. The two blocks 30 and 38 are mounted within a casing 40 of conductive material which includes end portions 41 and 42 formed with guide slots 43 and 44 to receive shank portions of bolts 21 and 23 and a central portion 45 which is between blocks 30 and 38 and which has a hole 46 therethrough to receive the shank portion of bolt 22. The casing 40 also includes side walls 47 and 48, the wall 48 being shown in the side elevational view of FIG. 3 and a portion of the upper block member being shown broken away in FIG. 2 to show a portion of the opposite side wall 47.

Important features relate to the provision of a central ground plane which is formed in part by plates 49 and 50 of conductive material in block 30 as shown in FIG. 4. Only a portion of plate 49 is shown in FIG. 4 since FIG. 4 is an offset sectional view. A portion of the block member 33 is shown broken away in FIG. 3, to show that the plate 49 extends to an end edge in proximity to the inner end of block 30 and to the central portion 45 of the casing 40. Similar plates are provided in the block 38 to define a central ground plane thereof. The plates 49 and 50 are insulated from the casing 40 but the plates 49 and 50 as well as the casing 40 are connectable directly or through by-pass capacitors to ground conductors of the circuit boards 18 and 19, so as to be at ground potential with respect to propagation of high frequency signals. Plates 49 and 50 and corresponding plates within the block 38 thus provide a substantially continuous ground plane. At the same time, since the plates 49 and 50 are electrically insulated from one another and from the casing 40 they may be used with the casing for conducting DC and low frequency AC voltages between the circuit boards 18 and 19.

A plurality of elongated conductive slugs 52 are provided within the blocks 30 and 38 for propagation of signals between the circuit boards 18 and 19, two of such slugs 52 being shown in FIG. 4. To connect upper and lower ends of such slugs to conductors of the circuit boards 18 and 19, compressible conductive buttons are provided. In the illustrated construction, such conductive buttons include two rows of buttons 53 and 54 at the upper ends of two rows of slugs in a first pair planes which are indicated by broken lines 55 and 56 and which are on opposite sides of the central ground plane defined by plates 49 and 50. Two additional rows of buttons 57 and 58 are provided at the upper ends of an additional two rows of slugs which are in a second pair of planes which are indicated by broken lines 59 and 60 and which on opposite sides of the central ground plane and between the first pair of planes 55 and 56 and the opposite side walls 47 and 48 of the casing 40.

A row of conductive buttons is also provided to connect upper edges of the plates 49 and 50 to conductors on the circuit board 18, including four buttons 61–64 engaged with the upper edge of plate 49 and two buttons 65 and 66 engaged with the upper edge of plate 50. Additional rows of conductive buttons 67 and 68 are engaged with upper edges of the side walls 47 and 48 of the casing 40.

Important features relate to the achievement of a uniform characteristic impedance for all signal propagation paths through the conductive slugs of the connector. In the illustrated construction the distance from the slugs of the first pair of planes 55 and 56 to the plates 49 and 50 is substantially equal to the distance from the slugs of the second pair of planes 59 and 60 to the side walls of the casing 40. It follows that the distance from the slugs of the first pair of planes 55 and 56 to the side walls 47 and 48 of the casing is equal to the spacing from the slugs of the second pair of planes 59 and 60 to the plates. Thus the relationship of each slug to planar surfaces of conductive material which are usable to provide circuit grounds is the same as that of each of the other slugs. In addition, the slugs are mounted in a uniform manner and with a uniform spacing from each slug to slugs adjacent thereto. The result is that uniform characteristic impedances are obtained. Preferably, the slugs in the first pair of planes 55 and 56 are in staggered relation to those of the second pair of planes 59 and 60, so as minimize the width of the connector while obtaining a uniform and desired spacing between each slug and slugs adjacent thereto.

The conductive buttons 53, 54, 57 and 58, 61-66, 67 and 68 are mounted in cavities in the upper surface 31 of the upper member 33 of block 30 for engagement with the conductive pads on the underside of the circuit board 19 and corresponding series of conductive buttons are mounted in cavities in the lower surface 32 of the lower member 34 of block 30 for engagement with the conductive pads on the upperside of the circuit board 18. Each of the buttons may typically be in the form of an elongated cylindrical contact element comprising a resiliently and randomly wadded thin gauge electrically conductive wire. Such buttons provide low impedance connections when proper contact pressures are maintained between such buttons and contact surfaces engaged thereby.

Two of the slugs 52 are shown in the offset sectional view of FIG. 4, having upper ends in the plane 56 and engaged with two of the buttons 54. Each slug 52 is positioned in an opening in the block 30 which is defined by aligned openings 69 and 70 in the upper and lower members 33 and 34, each slug being so positioned that terminal upper and lower end surfaces thereof are respectively spaced at substantially equal distances below and above the upper and lower surfaces 31 and 32 of the block 16 to provide cavities which receive one of the buttons 54 and a corresponding button 54A at the lower face of the connector. Only a cavity 71 at the upper end of one of the illustrated slugs 52 will be described in detail, the cavity at the lower end and other cavities of the connector being of substantially the same form.

Figure 5:
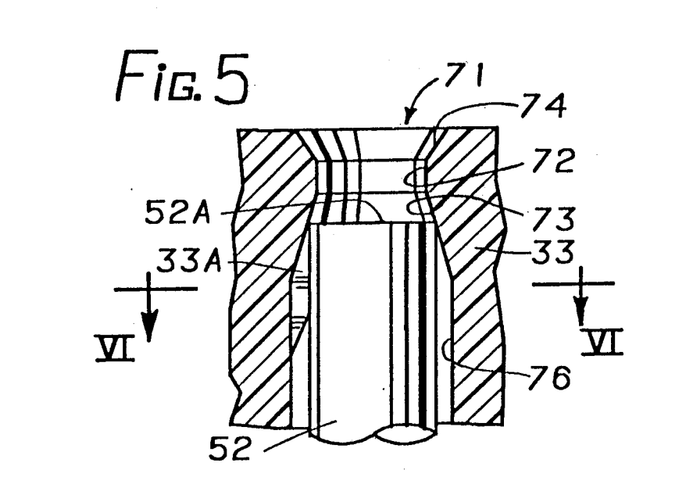
FIG. 5 is a cross-sectional view of a portion of the connector of FIG. 2 on an enlarged scale, showing details of a button-receiving cavity of an insulator member of the connector.

The cavity 71 in the upper member 33 has an "hour glass" shape and is defined by surface portions which include an intermediate neck portion 72, an inner flared portion 73 and an outer flared portion 74. The remainder of the opening 69 in the upper member 33 is defined by a right cylindrical surface portion 76 which extends downwardly from the lower end of the inner flared portion 73 to the lower surface of the member 33.

The neck portion 72 has a very small axial dimension and applies a localized compressive pressure to the button 54 when installed to securely hold the button 54 in place while allowing free resilient axial compression of the button 54 to obtain reliable low resistance connections. The inner flared portion 73 provides an expansion region into which a lower portion of the button expands when the button is installed, to additionally insure the secured holding of the button in place while allowing free resilient axial compression thereof. The outer flared portion 74 facilitates installation of the button and avoids entrapment of any protruding fine wire portions of the button between facing surfaces of the connector and circuit board. It also facilitates the free axial compression of the button when installed and accommodates any slight transverse relative shifting movements of the connector and circuit board as may occur during or after assembly. It preferably is of very smooth form, facilitating installation of the buttons and avoiding sharp edges which might catch and cause entrapment of protruding wire portions of the buttons.

Figure 6:
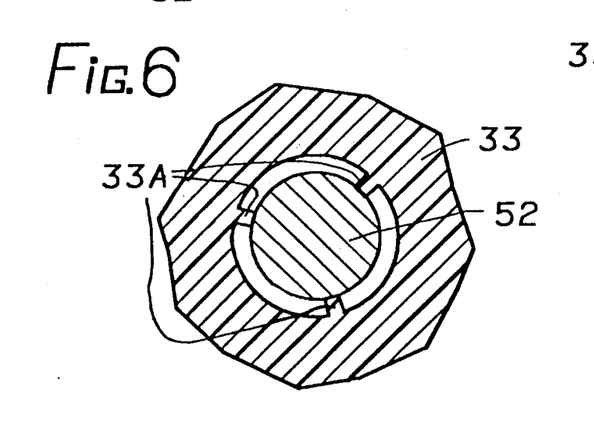
FIG. 6 is a cross-sectional view taken substantially along line VI—VI of FIG. 5.
Figure 7:
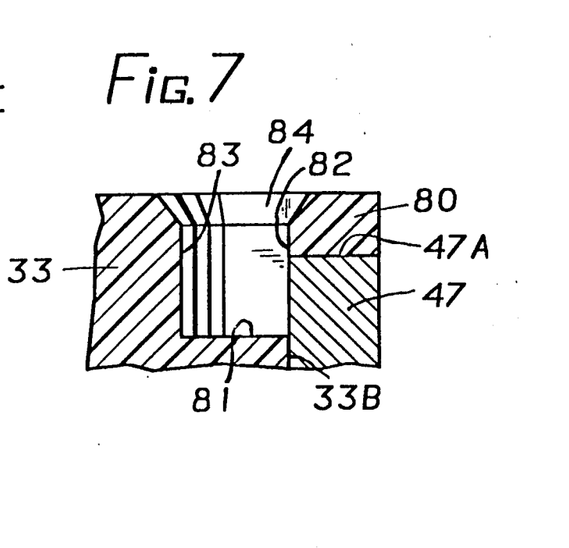
FIG. 7 is a cross-sectional view similar to FIG. 5, but showing details of a button-receiving cavity of an insulator member and its relationship to an upper edge portion of the side wall of a casing.

In assembling the connector, the members 33 and 34 are moved together while positioning the plates 49 and 50 to enter openings in the block members 33 and 34 and while positioning the slugs 52 to enter the openings of the members 33 and 34 at the interengageable lower and upper surfaces 35 and 36 thereof, so that the slugs 52 do not pass through the cavity-defining surfaces. The plates 49 and 50 and the slugs 52 may preferably be installed with a press fit using fixtures to obtain accurate positioning thereof. Terminal end portions of the slugs 52 are engaged by sets of protrusions 33A and 34A which are formed as integral parts of the block members 33 and 34 and which extend radially inwardly into localized pressure engagement with the slugs 52. FIG. 6 shows three protrusions 33A in 120 degree arcuately spaced relation and forming one set and each other set of protrusions may be formed in a similar manner. The protrusions 33A and 34A hold the slugs in centered relation in the openings 69 and 70 and provide for air gaps along the length of the slugs and for impedance control in accordance with important features of the invention as hereinafter described. Other equivalent means may be used to hold the slugs in centered relation and to provide air gaps along the length of the slugs. For example, collars may be provided on the slugs 52, either as separate members or as integral parts of the slugs 52, as shown for example in the aforesaid prior application Ser. No. 07/375,588.

When the slug 52 is installed as shown in FIGS. 3 and 4, its upper terminal end surface, indicated by reference numeral 52A, is positioned below the lower end of the neck portion 72 and its opposite terminal end surface 52B is similarly positioned with respect to the corresponding surface of a cavity at the lower side of the connector, thereby providing the aforementioned expansion regions. The block members 33 and 34 may be secured together by any suitable means, such as through the use of an adhesive at the interengaging surfaces 35 and 36.

After assembly of the block members 33 and 34 and the slugs 52, the buttons 53, 54, 57 and 58, 61-66, 67 and 68 are installed in the respective cavities which are provided above the slugs 52, the plates 49 and 50 and above upper edge portions of side walls of the casing 40. In its initial nominal or unstressed condition, each button may be of generally right cylindrical shape with a diameter substantially less than that of the outer flared portion 74 and only slightly greater than that of the neck portion 72, sufficient to securely hold the button in place while allowing free axial compression thereof to obtain electrically efficient contact pressures.

To facilitate assembly of the connector 11 with circuit boards, a pair of alignment pins 77 and 78 are press fitted into holes in the block 30 to project upwardly from block 30 and from block 38 and to extend into alignment holes of circuit board 18. The pins 77 and 78 may extend through the circuit board 18 and into alignment holes of blocks of the next higher connector 12. Similar pins may be installed to project from the opposite lower face of a connector, if desired. After assembly of all connectors in the assembly of FIG. 1 the nuts of the bolts 21-26 are tightened to compress all conductive buttons of the connectors 10-15 into pressure engagement with conductive pads of the circuit boards 17–20 and to obtain stable and reliable electrical contact therewith.

As is shown in FIG. 6, a modified type of cavity is provided for receiving the buttons 67 and 68 which engage the upper edges of casing side walls. The upper block member 33 has a pair outwardly protruding lip portions at its upper end which extend over upper terminal edges of casing side walls, one of such protruding lip portions 80 being disposed over the upper edge 47A of the casing side wall 47 as shown in FIG. 6. A cavity adjacent thereto includes a bottom surface 81 which is below the upper edge 47A of the casing side wall 47, a surface 82 which is aligned with a side surface 33B of the upper block member 33, a surface 83 which is partly of cylindrical form, an upper portion thereof extending to ends of the surface 82, and an outer surface 84 of beveled form. When a button is pressed into the cavity formed by the surfaces 81, 82, 83 and 84, a lower portion of the button is resiliently compressed in a side-wise direction into firm engagement with an upper inside surface portion of the casing side wall 47.

Further important features of the invention relate to the control of characteristic impedances in the signal propagation paths through the connector 11. In using the connector, the upper and lower end edges of the casing side walls 47 and 48 and the upper and lower end edges of the plates 49 and 50 are connected through conductive buttons to circuit board pads which are connected directly or through by-pass capacitors to ground, the casing side walls and the plates 49 and 50 thereby defining ground planes for the purpose of propagation of high frequency signals. Each of the slugs 52 is disposed between a pair of such ground planes and cooperates therewith to define a propagation path which has a substantially uniform cross-sectional configuration along its length and which thereby has a uniform characteristic impedance. A uniform characteristic impedance is highly desirable for the reason that undesirable reflections of energy, the development of standing waves, and attenuation of signals along the length of the paths are avoided. It is also found to be highly desirable that the characteristic impedances of the signal paths provided by the slugs be matched to characteristic impedances which are provided at the conductive pads of the interconnected circuit boards, circuit components on the boards and traces on the boards interconnecting such traces to the conductive pads. It is possible for the circuit board designer to so design a board as to obtain desired characteristic impedances at pads at which the efficient and reliable propagation of high frequency signals is critical. For this reason, it is found to be desirable that the characteristic impedance of each slug of the connector be known. Design is particularly facilitated by providing all slugs with the same characteristic impedance.

The characteristic impedance of a transmission line having uniform characteristics along its length is equal to the square root of the ratio of the series impedance per unit length to shunt admittance per unit length. At higher frequencies, the resistive terms of the series impedance and shunt admittance expressions are quite small and the characteristic impedance can be assumed for practical purposes to be equal to the square root of the ratio of the inductance per unit length to the capacitance per unit length. The inductance per unit length of a round conductor in parallel relation to ground planes is a function of its diameter and its spatial relationship to such ground planes. The capacitance per unit length of a conductor in parallel relation to ground planes is a function of the dielectric constant of the medium between the conductor and the ground planes. The spacing between adjacent slugs in the illustrated embodiment is 0.1 inches, the other dimensions being in the same proportions as illustrated in the drawings.

In accordance with the invention, an air space as indicated by reference numeral 86 is provided between outside surfaces of each slug 52 and the internal surfaces which are provided by the openings 69 and 70 in the block members 33 and 34. To permit assembly of the block members 33 and 34 in the casing 40 and assembly of plates 49 and 50 in the block members the relative dimensions are such that there are also air spaces between inside surfaces of the side walls 47 and 48 of casing 40 and the block members 33 and 34 of insulating material as well as between the surfaces of the plates 49 and 50 and the block members 33 and 34. The effect is to provide three capacitances in series relation each other and in shunt relation to the propagation path, one being that provided by the air space 86, another capacitance being provided by the dielectric material of the block members 33 and 34 and a third capacitance being provided by air spaces between the block members 33 and 34 and the casing side walls 47 and 48 and the plates 49 and 50. The dielectric constant of air is essentially unity while the dielectric constant of the block members is substantially higher. By controlling the dimensions of air spaces along the slugs 52, any desired characteristic impedance within a wide range may be obtained with any dielectric material having a given dielectric constant. In addition, by using the same dimensions for the air spaces for all slugs and by using the same relationships of all slugs to the adjacent ground planes as aforementioned, all slugs may provide paths of the same characteristic impedance to facilitate design of circuit boards to be interconnected.

In the illustrated construction, the slugs are of cylindrical shape and the protrusions 33A and 34A serve to accurately position each slug 52 in centered relation but any equivalent shape and locating means may be employed.

It will be understood that modifications and variations may be made. For example, in some applications, central ground plates such as plates 49 and 50 may not be required one or more rows of conductive slugs may be mounted between a pair of opposite side walls of a connector which may be grounded. Other modifications and variations may be effected without departing from the spirit and scope of the novel concepts of the invention.

We claim:

1. An electrical connector for connection of conductive pads of circuit boards, comprising: a block of insulating material having opposite surfaces in spaced generally parallel planes and having a row of spaced parallel openings therethrough extending between and in transverse relation to said opposite surfaces thereof, a row of elongated slugs of conductive material positioned in said openings with there being inward spacings between opposite terminal ends of each slug and said opposite surfaces of said block to provide a pair of cavities within each opening at the opposite ends of each of said slugs, a pair of resilient wadded conductor contact elements disposed in each of said pairs of said cavities for engagement with surfaces of conductive circuit board pads placed in alignment with said cavities and pressed toward said opposite surfaces of said block, and a wall portion of conductive material in parallel relation to said row of elongated slugs and having opposite edges adjacent said opposite surfaces of said block, said wall portion being arranged for connection to circuit board conductors to provide a ground plane in parallel relation to said row of elongated slugs.

2. An electrical connector as defined in claim 1, further including means defining a series of additional cavities along each of said opposite edges of said wall portion of conductive material, and resilient wadded conductor contact elements disposed in said additional cavities for engagement with said wall portion and with circuit board conductors which are positioned in alignment with said additional cavities and pressed against said opposite surfaces of said block.

3. An electrical connector as defined in claim 1, wherein said wall portion is a first wall portion extending along one side of said block, said connector further including a second wall portion of conductive material extending along an opposite side of said block in parallel relation to said first wall portion and extending in parallel relation to said elongated slugs.

4. An electrical connector as defined in claim 1, wherein said block member and said slugs are so configured as to provide an air dielectric along the length of each slug cooperating with the dielectric provided by said block to obtain a desired characteristic impedance.

5. An electrical connector as defined in claim 1, wherein a cross-sectional configuration of said slugs and of said block of insulating material is substantially uniform along the length of said slugs and wherein each slug provides a propagation path having a characteristic impedance which is uniform along its length.

6. An electrical connector as defined in claim 5, wherein all of said elongated slugs have substantially the same special relationship to said ground plane and to said block of insulating material to provide propagation paths having the same characteristics impedance.

7. An electrical connector as defined in claim 1, said block having a second row of spaced parallel openings therethrough extending in spaced parallel relation to the first row and between and in transverse relation to said opposite surfaces thereof, a second row of elongated slugs of conductive material positioned in said openings of said second row with there being inward spacings between opposite terminal ends of each slug and said opposite surfaces of said block to provide a pair of cavities within each opening of said second row at the opposite ends of each of said slugs, a pair of resilient wadded conductor contact elements disposed in each of said pairs of said cavities of said second row for engagement with surfaces of conductive circuit board pads placed in alignment with said cavities and pressed toward said opposite surfaces of said block.

8. An electrical connector as defined in claim 7, wherein said wall portion is an intermediate wall portion between said rows of slugs and defining a central ground plane.

9. An electrical connector as defined in claim 8, further including wall portions of conductive material on the outside of said connector defining additional ground planes.

10. An electrical connector as defined in claim 8, said wall portion is one of a plurality of intermediate wall portions of conductive material disposed in end-to-end relation insulated from one another but together defining a central ground plane of said connector.

11. An electrical connector as defined in claim 10, said wall portions being operative at different potentials for transmission of DC and/or low frequency AC voltages while being both operative at high frequencies as generally planar grounds with said slugs providing paths along and in spaced parallel relation to said wall portions for propagation of high frequency signals.

12. An electrical connector for connection of circuit board conductors, comprising: a block of insulating material having opposite surfaces and a row of spaced parallel openings therethrough extending between and in generally transverse relation to said opposite surfaces thereof, a row of slugs of conductive material positioned in said openings, means for connecting opposite ends of each of said slugs to conductors to be interconnected, and a wall portion of conductive material in parallel relation to said row of elongated slugs, said wall portion being arranged for connection to circuit board conductors to provide a ground plane in parallel relation to said row of elongated slugs, said block member and said slugs being so configured as to provide an air dielectric along the length of each slug cooperating with the dielectric provided by said block to obtain a desired characteristic impedance.

13. An electrical connector as defined in claim 12, further including means defining a series of means along each of said opposite edges of said wall portion of conductive material for engagement with said wall portion and with circuit board conductors which are positioned in alignment therewith.

14. An electrical connector as defined in claim 12, said block having a second row of spaced parallel openings therethrough extending in spaced parallel relation to the first row and between and in transverse relation to said opposite surfaces thereof, a second row of elongated slugs of conductive material positioned in said openings of said second row, and means for connecting opposite ends of each of said slugs of said second to conductors to be interconnected, said block member and said second row slugs being so configured as to provide an air dielectric along the length of each slug cooperating with the dielectric provided by said block to obtain a desired characteristic impedance.

15. An electrical connector as defined in claim 12, including means for holding said slugs in centered relation in said openings.

16. An electrical connector as defined in claim 12, wherein a cross-sectional configuration of said slugs and of said block of insulating material is substantially uniform along the length of said slugs and wherein each slug provides a propagation path having a characteristic impedance which is uniform along its length.

17. An electrical connector as defined in claim 16, wherein all of said elongated slugs have substantially the same spaced relationship to said ground plane and to said block of insulating material to provide propagation paths having the same characteristic impedance.

18. An electrical connector as defined in claim 12, wherein said wall portion is a first wall portion extending along one side of said block, said connector further including a second wall portion of conductive material extending along an opposite side of said block in parallel relation to said first wall portion and extending in parallel relation to said elongated slugs.

19. An electrical connector as defined in claim 18, wherein said wall portion is an intermediate wall portion between said rows of slugs and defining a central ground plane.

20. An electrical connector as defined in claim 19, further including wall portions of conductive material on the outside of said connector defining additional ground planes.

21. An electrical connector as defined in claim 19, wherein said wall portion is one of a plurality of intermediate wall portions of conductive material disposed in end-to-end relation insulated from one another but together defining a central ground plane of said connector.

22. An electrical connector as defined in claim 21, said wall portions being operative at different potentials for transmission of DC and/or low frequency AC voltages while being both operative at high frequencies as generally planar grounds with said slugs providing paths along and in spaced parallel relation to said wall portions for propagation of high frequency signals.

* * * * *

UNITED STATES PATENT AND TRADEMARK OFFICE
CERTIFICATE OF CORRECTION

PATENT NO. : 5,013,249
DATED : MAY 7, 1991
INVENTOR(S) : RICHARD J. LINDEMAN AND ROBERT J. SMITH, II

It is certified that error appears in the above-identified patent and that said Letters Patent is hereby corrected as shown below:

ON THE TITLE PAGE:

[60] Related U.S. Application Data

"Jun. 19, 1986" should read --Dec. 29, 1986 --;

line 5, "which is a" should read --; also --;

line 6, "which is a" should read -- and --.

[56] References Cited

U.S. PATENT DOCUMENTS

"4,705,332 11/1987", "Sadigh-Benzadi" should read -- Sadigh-Behzadi --.

[57] ABSTRACT line 7, "or" should read -- of --.

IN THE CLAIMS:

Column 9, line 37, "special" should read -- spacial --;

Column 9, line 39, "characteristics" should read -- characteristic --;

Column 9, line 64, after "claim 8," add -- wherein --; and

Column 10, line 55, "spaced" should read -- spacial --.

Signed and Sealed this

Twenty-seventh Day of December, 1994

Attest:

BRUCE LEHMAN

Attesting Officer       Commissioner of Patents and Trademarks